United States Patent
de Vries et al.

(10) Patent No.: US 6,774,569 B2
(45) Date of Patent: Aug. 10, 2004

(54) APPARATUS FOR PRODUCING AND SUSTAINING A GLOW DISCHARGE PLASMA UNDER ATMOSPHERIC CONDITIONS

(75) Inventors: Hindrik Willem de Vries, Tilburg (NL); Fuyuhiko Mori, Tilburg (NL); Eugen Aldea, Tilburg (NL); Mauritius Cornelius Maria van de Sanden, Tilburg (NL)

(73) Assignee: Fuji Photo Film B.V., Tilburg (NL)

( * ) Notice: Subject to any disclaimer, the term of this patent is extended or adjusted under 35 U.S.C. 154(b) by 0 days.

(21) Appl. No.: 10/192,860

(22) Filed: Jul. 11, 2002

(65) Prior Publication Data
US 2004/0007985 A1 Jan. 15, 2004

(51) Int. Cl.[7] .............................. H01J 7/24; H01J 17/26
(52) U.S. Cl. .............................. 315/111.21; 315/111.71; 313/231.31
(58) Field of Search ........................ 315/111.21, 111.31, 315/111.41, 111.51, 111.81, 111.91, 111.71; 313/231.31, 231.41; H01J 7/24

(56) References Cited
U.S. PATENT DOCUMENTS

| | | | | |
|---|---|---|---|---|
| 3,917,992 A | * | 11/1975 | Volkov et al. | 363/126 |
| 5,095,247 A | * | 3/1992 | Hanamura | 315/111.21 |
| 5,365,147 A | * | 11/1994 | Shinohara et al. | 315/111.21 |
| 5,387,842 A | * | 2/1995 | Roth et al. | 315/111.21 |
| 5,414,324 A | * | 5/1995 | Roth et al. | 315/111.21 |
| 5,474,648 A | * | 12/1995 | Patrick et al. | 438/10 |
| 5,876,663 A | * | 3/1999 | Laroussi | 422/23 |
| 5,968,377 A | * | 10/1999 | Yuasa et al. | 219/121.41 |
| 6,046,546 A | * | 4/2000 | Porter et al. | 315/111.21 |
| 6,299,948 B1 | * | 10/2001 | Gherardi et al. | 427/569 |

* cited by examiner

*Primary Examiner*—Don Wong
*Assistant Examiner*—Trinh Vo Dinh
(74) *Attorney, Agent, or Firm*—Davidson Berquist Klima & Jackson LLP

(57) ABSTRACT

Apparatus for producing and sustaining a glow discharge plasma in a plasma discharge space comprising at least two oppositely spaced electrodes, means for supplying a gas or a gas mixture under atmospheric pressure conditions in the discharge space, AC power supply means for energizing the electrodes, and electric stabilisation means for stabilizing current variations in the plasma. The stabilisation means connect between the electrodes and the power supply means, and are arranged for providing a negative feedback opposed to a positive feedback of the plasma to instabilities in the plasma.

29 Claims, 3 Drawing Sheets

APPARATUS FOR PRODUCING AND SUSTAINING A GLOW DISCHARGE PLASMA UNDER ATMOSPHERIC CONDITIONS

FIELD OF THE INVENTION

The present invention relates generally to discharge plasma systems and methods, and more specifically to an apparatus and method for generating a glow discharge plasma under atmospheric pressure conditions.

BACKGROUND OF THE INVENTION

Atmospheric Pressure Glow (APG) discharge is used in practise, among others, for non-destructive material surface modification. Glow discharge plasmas are relatively low power density plasmas, typically generated under atmospheric pressure conditions or partial vacuum environments.

In practise, the plasma is generated in a plasma chamber or plasma discharge space between two oppositely arranged parallel plate electrodes. The plasma is generated in a gas or a gas mixture in the discharge space by energizing the electrodes from AC power means.

It has been observed that a stable and uniform plasma can be created in, for example, a pure Helium or a pure Nitrogen gas. However, as soon as impurities or other gasses or chemical compositions at ppm level are present in the gas, the stability of the plasma will decrease significantly. Typical examples of stability destroying components are $O_2$, $NO$, $CO_2$, etc.

It has been observed that instabilities in the plasma will develop either in a high current density plasma or will extinguish locally the plasma. As a result, current arcing occurs and the glow discharge plasma can not be maintained. Instead, a combination of filamentary and glow discharge is generated.

Filamentary discharges between parallel plate electrodes in air under atmospheric pressure have been used to generate ozone in large quantities but are of limited use for the surface treatment of materials, since the plasma filaments tend to puncture or treat the service unevenly and are associated with relatively high plasma currents.

U.S. Pat. No. 5,414,324 discloses a plasma chamber having a first or upper electrode through which air is injected and a second or counter electrode on which the substrate to be treated is located. For protecting the substrate to be treated against sparks, i.e. current arcing in the plasma, an electrically conductive grid is provided between the oppositely spaced electrodes, which grid connects by an inductor with a large inductance (choke coil).

From experiments disclosed by U.S. Pat. No. 5,414,324 it appears that for practical use an inductor having an inductance of 100 H and even higher has to be applied.

Those skilled in the art will appreciate that the combination of conductive grid and high inductance is a design which can be used only for over-current protection, being in fact a solution for damping the current of the sparks developed in the plasma and preventing that the sparks will reach the counter electrode where the material to be treated in plasma is located. The solution disclosed in U.S. Pat. No. 5,414,324 can have only a small effect at normal low current operating conditions and can affect only slightly the plasma stability and will not protect against the formation of sparks. A spark is already there when the inductor starts to react.

Further, inductors of the size disclosed above require a relatively large amount of space and, due to the magnetic core required, have a significant weight. Further, the conductive grid limits the effective discharge space for treating a substrate by the plasma.

SUMMARY OF THE INVENTION

It is, therefore, an object of the present invention to provide a novel and improved apparatus and method for producing and sustaining a uniform glow discharge plasma.

This and other objects and features of the invention are achieved according to the present invention by an apparatus for producing and sustaining a glow discharge plasma in a plasma discharge space comprising at least two oppositely spaced electrodes, means for supplying a gas or a gas mixture under atmospheric pressure conditions in the discharge space, AC power supply means for energizing the electrodes, and electric stabilisation means for stabilizing current variations in the plasma, the stabilisation means connect between the electrodes and the power supply means, and are arranged for providing a negative feedback opposed to a positive feedback of the plasma to instabilities in the plasma.

Compared to the prior art solution as presented by U.S. Pat. No. 5,414,324 in the present invention, the plasma discharge space is not obstructed by the introduction of an electrically conductive screen and the like.

Electrically, an APG system can be represented by an equivalent RLC circuit diagram comprised of a capacitance C, mainly due to the capacitance of the spaced electrodes, an inductance L and a plasma resistance R. The inductance component includes APG self-inductance and the equivalent inductance of system coupling to the power supply. When the APG is coupled to a power supply by a transformer, the equivalent inductance of the coupling system is of a significant order of at least a few mH.

At plasma breakdown large current oscillations can be generated as a consequence of the current resonance generated by the RLC circuit. These current oscillations set a ground for the generation of waves in the plasma and the constriction of the plasma column. Due to the relatively low value of the APG self-inductance, the resonance frequency is high and is preferentially excited at breakdown. Accordingly, during the plasma breakdown high amplitude and current oscillations are developed which are a major risk for plasma stability. Also a strong electromagnetic emission is developed due to the self-resonance of the APG inductance and capacitance.

In a further embodiment of the invention, the stabilisation means are arranged for decreasing plasma voltage proportional to the rate of plasma current variation and/or to an electromagnetic field radiated by the plasma.

The present invention is based on the insight that the insertion of a negative feedback stabilisation means is functional at the plasma breakdown when the voltage applied to the plasma is decreased on a short time scale. To prevent the development of undesired high current oscillations, in a preferred embodiment of the invention the inductive component of the impedance of the stabilization means has to decreased substantially after the plasma breakdown. Also in order to prevent plasma instabilities initiated by low current streamers, the stabilization means are arranged in such a way that a negative feedback not only provided to the plasma current but also to the plasma electromagnetic radiation too. In this manner filamentary discharges in plasmas can be effectively avoided.

From experimentally obtained data, it has been shown that the solution according to the present invention results in a very stable plasma for a variety of different supply gases, excitation conditions, electrode designs and electrode spacings.

During breakdown, the plasma is in its most unstable phase in which even small voltage variations can easily affect plasma stability. By introducing a relatively large inductance, such as disclosed by U.S. Pat. No. 5,414,324, the voltage variations will be large and, as consequence, the plasma stability will be adversely affected.

In order to prevent the generation of the plasma oscillations and the reduction of the current amplitude after the critical phase of plasma breakdown, in the preferred embodiment of the present invention, the stabilization means are arranged for a substantial decrease of inductance after the plasma breakdown. Preferably, the stabilisation means are arranged for a substantial decrease of inductance at a plasma current density above approximately 1 mA/cm². A decrease of inductance of at least one order of magnitude appears to be sufficient.

In a practical embodiment of the apparatus according to the present invention, the stabilisation means comprise inductor means. Those skilled in the art will appreciate that inductor means generate voltages opposed to the rate or speed of APG magnetic flux variation and APG current variation, dependent on their inductance.

By series connecting the inductor means and at least one of the electrodes to the power supply, a very simple electric circuit is obtained. For reasons of symmetry and obtaining a uniform as possible plasma, each of the electrodes of the APG apparatus series individually connects by inductor means to the power supply.

The inductor means, in a yet further embodiment, may comprise electronic inductor circuitry which, as such, are known to the skilled person. In a preferred embodiment of the invention, the inductor means comprise choke coil means.

Choke coil means having a core of ferromagnetic material comprising any of the group of ferrite which can saturate at low magnetic fields of order of 100 mT and which can operate at MHz frequencies, will provide a reduced impedance or inductance at plasma breakdown.

That is, by designing the core such that it saturates at plasma current values occurring during plasma breakdown, the impedance of the choke coil will reduce and large voltage variations will be avoided, and thereby additional plasma instability due to the choke coil. By directly series connecting the choke coil means with the power supply and the electrodes of the APG, the saturation effect will be directly effected by the plasma discharge current.

The use of inductors as such is a standard method to use in the design of the electronic circuitry as a simple way to filter high frequency voltage oscillations. However those skilled in the art will appreciate that the fast current variations associated with the plasma filamentation are rather current oscillations (plasma is the equivalent of a low impedance current source) and not voltage oscillations, and their damping is not straightforward. In most of the cases inserting a inductor in series with the stray capacitance of an atmospheric plasma reactor will form a LC resonant circuit and will generate large current oscillations which are increasing the plasma instability and the tendency to go in a filamentary form. Also a major seed for filamentation of atmospheric glow plasmas is the risk of generating high current density but of low current (of order of 1 mA) filamentary plasma types called streamers. Those skilled in the art will appreciate that due to low current, the development of streamer instabilities can not be straightforwardly prevented by the negative feedback to the streamer current generated by a inductor in series with the plasma.

In a practical embodiment of the invention, the inductor means can be designed for having an inductance of less then 10 H once the plasma has been produced. The inductor inductance before the saturation can be chosen using the formula given below:

$$L \approx \frac{10^5}{I_{\max}\tau}$$

wherein: L is the inductance of the choke coil;

$I_{max}$ is the amplitude of current (without the use of inductor means);

$\tau$ is the breakdown development time (without the use of inductor means).

The required inductance is of the order of 10-50 mH/cm².

In the case that the power supply means comprise an LC filter network (impedance matching network) used for the purpose of achieving optimum power transfer and filtering of the reflection of the plasma current to the power source, in accordance with the present invention, at least one of the electrodes connects by the inductor means to the LC filter network.

As was mentioned above in the case that the APG is powered through a transformer the coupling line has a considerable inductance which is not satisfying the design criteria required for an inductor stabilising means. In this case the coupling of the APG and of the inductor means to the transformer equivalent inductance must be weak in order to avoid the coupling of the APG to a unwanted inductance. To achieve this purpose the reflection of the plasma current in the secondary of the transformer must be reduced to minimum through the use of a filter network including LC, Π or T networks.

In this case, the inductor means and the filter network have to be designed carefully for an effective damping of the high frequency components of the plasma current in the secondary of the transformer and to the power source current. A further advantage of the solution according to the present invention is that the inductor means, such as the choke coil means, provide a significant contribution to the reduction of reflected power to the power supply means.

Preferably, the inductor means should have a cut-off frequency above which their impedance is highly resistive, as a further measure of limitation of the current oscillations.

In order to have an effective as possible filtering of the undesired plasma electromagnetic radiation, the inductor means should be arranged in such a way that the flux of the plasma magnetic field through the inductor is maximized.

In an embodiment of this invention the inductor means are connected electrically as close as possible to one or both electrodes or to the plasma region.

In another embodiment of this invention the APG reactor itself is used as an inductor means by packing the APG in a ferromagnetic material.

In a preferred embodiment of the apparatus according to the invention, due to the fact that no screen for connecting the choke coil means and the like between the oppositely spaced electrodes is required, the electrodes can be spaced at a distance from 0.01 mm.

Due to the effective suppression of the current oscillations, the gas for generating the plasma can be selected from a group comprising Helium, Argon, Nitrogen, Air, Oxygen, Carbon Dioxide, and a mixture comprising any of the gasses of the group.

In a preferred embodiment of the invention, the gas is a mixture of noble gas such as helium or argon and a chemically active gas such as air, oxygen and carbon dioxide. The gasses may also comprise of specific chemical compositions which are usually involved in the chemical vapour deposition processes such as $SiH_4$, hydrocarbons, organosilicons such as TEOS and HMDSO, and organo-metallics.

In a embodiment of this invention the slope of the AC voltage is arranged in such a way that the pulse duration is larger than the period of the resonant frequency of the inductor means and APG capacitance. In this way the stability of the plasma is substantially increased. Such a condition can be achieved if for example the AC frequency is higher than 50 kHz.

In a preferred embodiment of this invention the slope of the AC voltage is arranged in such a way that the time required for the development of plasma breakdown in all the volume of the APG is shorter than 200 ns. In this way the stability of the plasma is substantially increased. Such a condition can be achieved if for example the AC frequency is higher than 50 kHz.

The invention further provides a method for generating and sustaining a glow discharge plasma in a plasma discharge space comprising at least two oppositely spaced electrodes, by introducing a gas or gas mixture under atmospheric pressure conditions in the discharge space, by energizing the electrodes using AC power supply means and by stabilizing current variations in the plasma using electric stabilisation, the stabilisation means connect between the electrodes and the power supply means, and wherein the stabilization means operate to provide a negative feedback opposed to a positive feedback of the plasma to instabilities in the plasma.

In a preferred embodiment of the method according to the invention, the stabilisation means operate for decreasing plasma voltage proportional to the rate of plasma current variation and/or to the electromagnetic field radiated by the plasma.

In a preferred embodiment of the invention the stabilisation means operate to provide a substantial decrease of the inductive component of its impedance after plasma breakdown.

In a yet further embodiment of the method according to the invention, the stabilisation means operate to be substantially resistive above a specified frequency.

The apparatus and method according to the present invention can be used in practise for a wide variety of applications, such as but not limited to a device for plasma surface treatment of a substrate, such as surface activation processes which substrate can be glass, polymer, metal, etc., and generation of hydrophilic or hydrophobic surfaces; plasma device for the chemical vapour deposition process; plasma device for decomposition of gasses containing volatile ozone component; plasma device for removing toxical compounds from the gas phase; plasma device for surface cleaning purposes such as in the sterilisation or dry cleaning processes.

The above-mentioned and other features and advantages of the invention are illustrated in the following description with reference to the enclosed drawings.

DETAILED DESCRIPTION OF THE DRAWINGS

Figure 1:
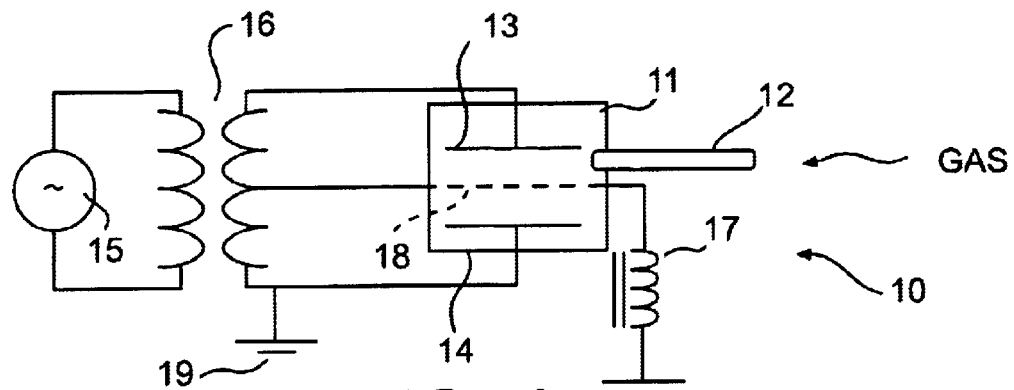
FIG. 1 shows, in a very schematic manner, an electric circuit diagram of the prior art APG apparatus as taught by U.S. Pat. No. 5,414,324.

Without the intention of limitation, the present invention will now be disclosed in more detail with respect to the attached drawings. In the drawings, like parts are designated by like reference numerals.

The circuit diagram of the prior art apparatus 10 comprises a plasma chamber or plasma discharge space 11 and means 12 for supplying a gas or a gas mixture under atmospheric pressure conditions in the discharge space 11. For producing and sustaining a glow discharge plasma in the plasma discharge space 11, at least two oppositely spaced electrodes 13 and 14 in the discharge space 11 connect to AC power supply means 15, preferably AC power means, via an intermediate transformer stage 16.

For stabilizing current variations in the plasma in the discharge space 10, stabilisation means in the form of a choke coil 17 connect between system earth 19 and an electrically conductive screen 18 arranged between the electrodes 13, 14, and shown in dotted lines.

The screen 18 effectively limits the available space between the electrodes 13, 14 for treating a substrate or the like by the plasma. Further, the choke coil 17 need to be designed having a relatively high inductance of 100 H and more, which makes it very expensive and bulky.

Figure 2:
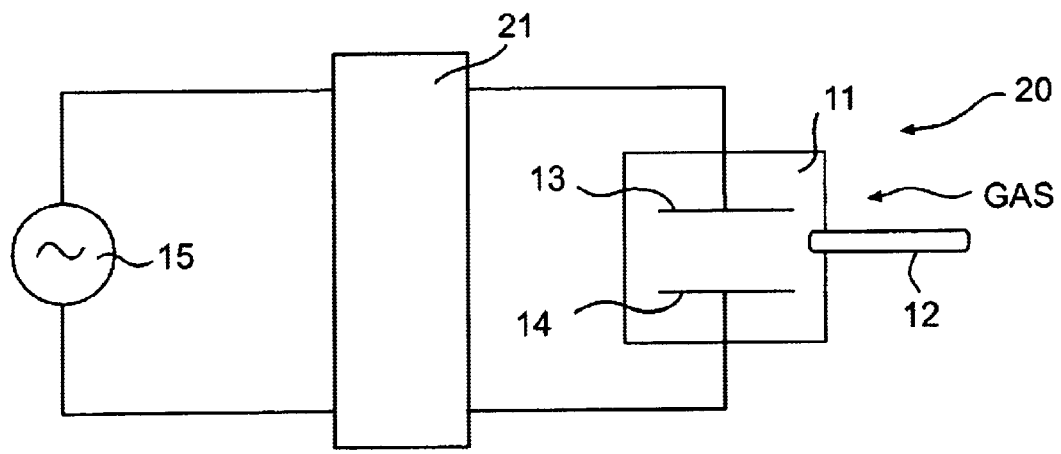
FIG. 2 shows, in a very schematic manner, an electric circuit diagram of a general embodiment of the apparatus according to the present invention.

FIG. 2 shows a general circuit diagram 20 of the apparatus according to the present invention, wherein stabilisation means 21 connect between the electrodes 13, 14 and the power supply means 15, or the transformer stage 16, if available.

In accordance with the present invention, the stabilisation means 21 are arranged for decreasing plasma voltage proportional to the rate of plasma current variation and/or to the rate of the plasma magnetic field variation.

In a preferred embodiment of the invention, the stabilisation means comprise means having inductive properties, that is generating voltages proportional and opposed to the speed or rate of variation of the current and of the magnetic field radiated by plasma.

$$V_{ind} = -L\, dI/dt - d\Phi/dt$$

wherein: $V_{ind}$=induced voltage [Volt]

I=plasma current [Ampere]

L=inductance [Henry].

$\Phi$=flux of the magnetic field radiated by the plasma in the inductor means region.

The stabilisation means 21 may comprise electronic inductor means and/or electric inductor means like a coil.

Figure 3:
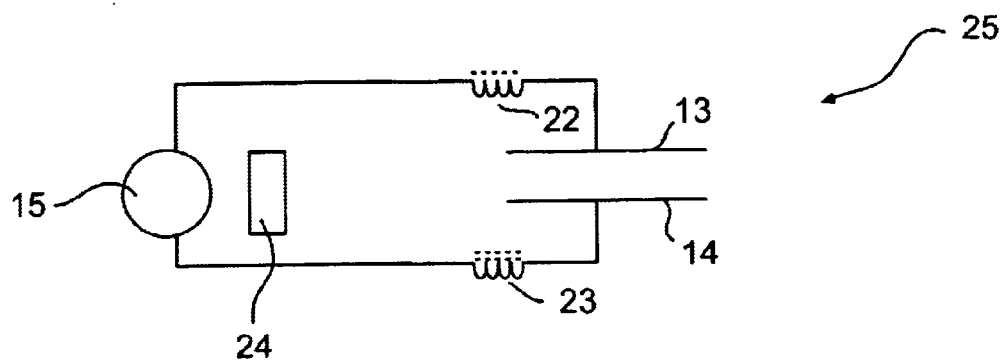
FIG. 3 shows, in a very schematic manner, an electric circuit diagram of a preferred embodiment of the apparatus according to the present invention.

FIG. 3 shows a circuit diagram 25 in accordance with the present invention, wherein at least one choke coil, 22 or 23, series connect with an electrode 13 or 14, respectively, and the AC power supply means 15.

Reference numeral 24 designates an impedance matching circuit, such as an LC parallel circuit, mainly for the purpose of reducing reflective power from the electrodes 13, 14 back to the power supply means 15, or the transformer 16, if available. The impedance matching circuit 24 contributes to the an increased plasma stability.

Figure 4:
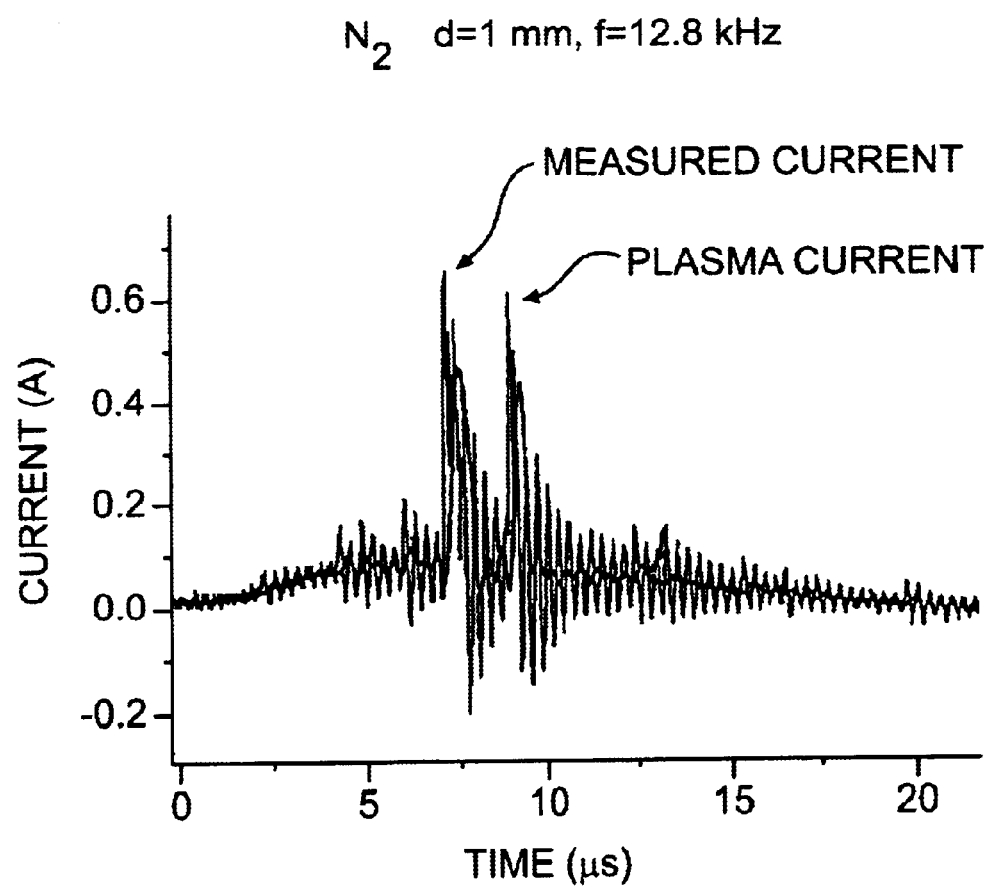
FIG. 4 shows a graph of typical plasma current oscillations which may occur in Nitrogen.

FIG. 4 shows a graph of typical plasma current oscillations which may occur in Nitrogen in an arrangement comprising the LC matching circuit 24, however not comprising the stabilisation means 21 according to the present invention.

As can be seen from FIG. 4, the impedance matching circuit 24 cannot filter high frequency current oscillations at the operating frequency of 12.8 kHz and, in general, frequencies in the order of 1–15 MHz. These oscillations are created by fast plasma current increase due to impurities and the like, as disclosed in the introductory part.

Suppression of such plasma current oscillations having a relatively high speed or rate of change dI/dt are suppressed by the stabilisation means in accordance with the present invention. That is, during the fast increase of the plasma current, the stabilisation means reduce the voltage over the electrodes to below the breakdown voltage ($V_t$), such that the plasma discharge extinguishes.

Using choke coil means or in general inductor means in series with the power supply means, allows to increase the pulse duration, because the coil or coils will increase the voltage applied to the plasma when the current decreases.

However, during ignition, the plasma is very unstable, such that large voltage variations may result in extinguishing of the plasma.

In order to prevent such unwanted situations, in a preferred embodiment of the invention, the stabilisation means are arranged for a substantial decrease of impedance at plasma breakdown, such as, but not limited to a plasma current density above approximately 1 $mA/cm^2$.

This is achieved, in an embodiment of the invention by using choke coil means, wherein the or each choke coil comprises a core of ferromagnetic material. For radio frequency (RF) power supplies a core of ferrite is advantageous, designed such that the core comes magnetically in saturation at plasma currents which occur during ignition. As will be appreciated by those skilled in the art, due to the saturation of the core, the magnetic inductance of the choke coil decreases and large voltage variations are effectively prevented. The number of windings of a choke coil should be calculated such that the core comes into saturation for currents in the order of 1 $mA/cm^2$.

Arranging the stabilisation means for a decrease of impedance of at least one order of magnitude suffices for most of the APG systems. Preferably, to conclude in the saturation region, the choke coil means are substantially resistive above a specified frequency.

In the embodiment shown in FIG. 3, for a typical ferrite core having a relative magnetic permeability of 2000–5000 the choke coils may be designed with an inductance of less than 10 $H/cm^2$ and preferably between 0.01 $mH/cm^2$ and 1 $mH/cm^2$, once the plasma has been ignited. The inductor means negative feedback provided to the plasma instabilities is efficient only at frequencies above 10 kHz.

Several experiments have been conducted in order to show the improved operation of the arrangement according to the present invention:

Experiment 1
  Gas=Nitrogen;
  Experimental set-up in accordance with FIG. 5

Figure 5:
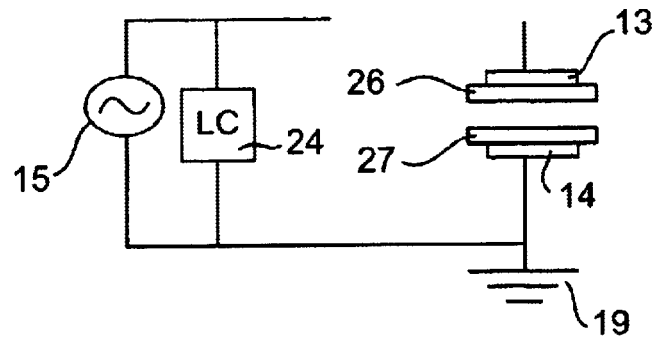
FIGS. 5–7 show, in a very schematic manner, electric circuit diagrams of experimental set-ups.

The plasma is discharged in the space between the conductive electrodes 13 and 14, which are covered by dielectric material 26 of the type of Enamel and 27 of the of type PE, as shown in FIG. 5. The gap between the covered electrodes is 0.6 mm. $N_2$ gas is fed into the space between the dielectrics 26 and 27 with a flow rate of 15 L/min.

An AC voltage of 4 KV is applied to the electrodes in order to ignite the plasma. The frequency of the power supply 15 is 13 kHz. A common LC network 24 is parallel connected to the power supply 15.

The stability of the plasma is judge by analysing the I-V characteristics, which is described in U.S. Pat. No. 6,299,948. In this experiment it is seen that the plasma is stable, i.e. there is only one current peak generated within the half cycle of the voltage wave.

Figure 6:
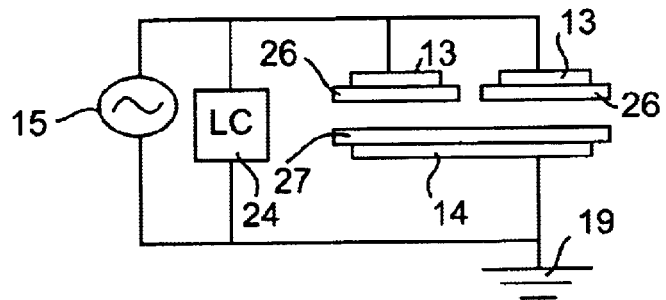

Comparative 1
  Experimental set-up in accordance with FIG. 6

A similar plasma set-up as Experiment 1 is used, except that two pairs of electrodes 13, 14 are used (FIG. 5). The distance between one pair of electrodes to another is 5 mm. By applying the condition as mentioned in Experiment.1, an unstable plasma was observed; i.e the I-V characteristic showed several current peaks within the half cycle of the voltage wave form.

Figure 7:
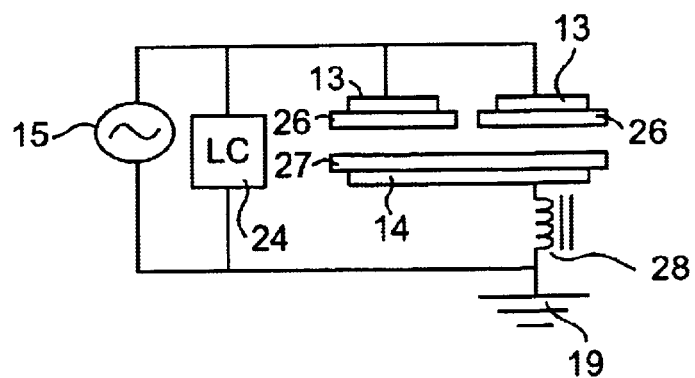

Experiment 2
  Experimental set-up in accordance with FIG. 7

A Ferrite choke coil of a material type 3F3 (MnZn Ferrite type), purchased from Ferroxcube Netherlands, having an induction of 6 mH is series connected to the lower electrode 14 and the power supply 15. Under the same gas, voltage and frequency conditions as mentioned in Comparative 1, a stable plasma was observed from the I-V characteristic.

Comparative 2
  Gas=Air.

Plasma discharge was generated by using the set-up as described in example 1, except that air is used as gas. The flow rate of the air is 15 L/min., AC voltage applied 4 kV with frequency of 13 kHz. The gap between the electrodes is 1 mm. Observation from the I-V characteristic showed that there are a lot of high frequency pulses within a half cycle of the voltage wave form.

Experiment 3

Same set up as comparative 2, wherein the ferrite coil as it is described in example 2, is placed in the lower electrode 14. The results show that a stable plasma is generated.

Experiment 4
  Gas=Argon

Similar experiments as described in the experiments which have been performed for Nitrogen gas (Experiment 1 & 2 and Comparative 1) was repeated by using Argon gas. The gap between the electrode is 1.5 mm. The I-V characteristic showed similar results as in the case of Nitrogen gas.

From the experiments and comparatives above, it will be clear that the arrangement and method according to the present invention provides significant improved plasma under atmospheric conditions, i.e. APG systems.

The invention can be advantageously applied in surface treatment applications of a substrate.

The invention is not limited to the embodiments and experiments disclosed and described above. Those skilled in the art will appreciate that many modifications and additions can be made without departing from the novel and inventive scope of the invention as defined in the appending claims.

What is claimed is:

1. An apparatus for producing and sustaining a glow discharge plasma in a plasma discharge space comprising at least two spaced apart electrodes, means for supplying a gas or a gas mixture under atmospheric pressure conditions in said discharge space, an AC power supply for energizing said electrodes, and electric stabilization means for stabilizing current variations in said plasma, said stabilization means connected between said electrodes and said power supply for providing a negative feedback by decreasing plasma voltage opposed to a positive feedback reaction in said plasma caused by plasma current variation.

2. The apparatus according to claim 1, wherein said stabilization means are arranged for decreasing said plasma voltage proportional to said plasma current variation.

3. The apparatus according to claim 1, wherein said stabilization means decreases plasma voltage proportional to an electromagnetic field radiated by said plasma.

4. The apparatus according to claim 3, wherein said stabilization means are arranged for a substantial decrease of said impedance at a plasma current density above approximately 1 mA/cm$^2$.

5. The apparatus according to claim 3, wherein said stabilization means are arranged for a decrease of said impedance of at least one order of magnitude.

6. The apparatus according to claim 1, wherein said stabilization means comprise inductor means.

7. The apparatus according to claim 6, wherein at least one of said electrodes and said inductor means series connect to said power supply.

8. The apparatus according to claim 6, wherein said inductor means comprise electronic inductor circuitry.

9. The apparatus according to claim 6, wherein said inductor means comprise at least one choke coil.

10. The apparatus according to claim 9, wherein the or each choke coil comprises a core of magnetic ferrite material.

11. The apparatus according to claim 6, wherein said inductor means are designed for having an inductance of less than 10 H/cm$^2$ once said plasma has been produced.

12. The apparatus according to claim 11, wherein said inductance is between 0.01 mH/cm$^2$ and 1 mH/cm$^2$.

13. The apparatus according to claim 6, wherein said AC power supply comprise an impedance matching network, arranged for providing an electrically weak coupling of said APG plasma and said AC power supply, wherein at least one of said electrodes connects by said inductor means to said impedance matching network.

14. The apparatus according to claim 13, wherein said impedance network comprises an LC parallel network.

15. The apparatus according to claim 6, wherein said AC voltage has a slope arranged such that its pulse duration is larger than resonant frequency period of said inductor means and atmospheric pressure glow capacitance.

16. The apparatus according to claim 6, wherein said AC voltage has a slope arranged such that time required for development of a plasma breakdown in all its volume of said atmospheric pressure glow discharge is shorter than 200 ns.

17. The apparatus according to claim 1, wherein said stabilization means are substantially resistive above a specified frequency.

18. The apparatus according to claim 1, wherein said stabilization means connect electrically as close as practically possible to said at least one of said electrodes and said plasma.

19. The apparatus according to claim 1, wherein said atmospheric pressure glow discharge is used itself as a stabilization means in that said atmospheric pressure glow discharge is packed in a ferromagnetic material.

20. The apparatus according to claim 1, wherein said electrodes are oppositely spaced over a distance of between 0.01 mm and 3 cm.

21. The apparatus according to claim 1, wherein said gas is selected from a group comprising Helium, Argon, Nitrogen, Air, Oxygen, Carbon Dioxide, and a mixture comprising any of said gasses of said group.

22. The apparatus according to claim 1, wherein said gas is a mixture of a nobel gas and a chemically active gas.

23. The apparatus according to claim 1, wherein said AC power supply are arranged for energizing said electrodes at a frequency between 10 kHz and 1 MHz.

24. A method for generating and sustaining a glow discharge plasma in a plasma discharge space comprising at least two spaced apart electrodes, by introducing a gas or gas mixture under atmospheric pressure conditions in said discharge space, by energizing said electrodes using AC power supply means and by stabilizing current variations in said plasma using electric stabilization means, said stabilization means being connected between said electrodes and said power supply and wherein said stabilization means provides a negative feedback by decreasing plasma voltage opposed to a positive feedback reaction in said plasma caused by plasma current variation.

25. A method according to claim 24, wherein said stabilization means operate for decreasing said plasma voltage proportional to said plasma current variation.

26. A method according to claim 24, wherein said stabilization means operate for decreasing said plasma voltage proportional to an electromagnetic field radiated by plasma.

27. A method according to claim 24, wherein said stabilization means comprise an impedance having an inductive component and wherein said stabilization means operate to provide a substantial decrease of said inductive component of said impedance plasma breakdown.

28. The method according to claim 24, wherein said stabilization means operate to be substantially resistive above a specified frequency.

29. A system for treating a surface of a substrate using a glow discharge plasma in a plasma discharge space, comprising:

at least two spaced electrodes;

means for supplying a gas or gas mixture under atmospheric pressure conditions in said discharge space;

an AC power supply for energizing said at least two spaced electrodes; and electric stabilization means, connected between said at least two spaced electrodes and said AC power supply said electric stabilization means providing a negative feedback by decreasing plasma voltage opposed to a positive feedback reaction in said plasma caused by plasma current variation.

* * * * *